United States Patent
Nagai et al.

(10) Patent No.: US 6,466,490 B2
(45) Date of Patent: Oct. 15, 2002

(54) SEMICONDUCTOR MEMORY CIRCUIT

(75) Inventors: Takeshi Nagai, Yokohama (JP); Takahiko Hara, Yokohama (JP); Masaru Koyanagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/956,255

(22) Filed: Sep. 20, 2001

(65) Prior Publication Data

US 2002/0060931 A1 May 23, 2002

(30) Foreign Application Priority Data

Sep. 20, 2000 (JP) .................................. 2000-285983

(51) Int. Cl.[7] ................................................ G11C 7/00
(52) U.S. Cl. .................. 365/189.12; 365/220; 365/221; 365/239; 365/240
(58) Field of Search ........................... 365/189.12, 220, 365/221, 63, 239, 240

(56) References Cited

U.S. PATENT DOCUMENTS 4,024,514 A * 5/1977 Elmer et al. ................ 340/173
4,165,541 A * 8/1979 Varshney et al. ............ 365/219
4,800,530 A * 1/1989 Itoh et al. ................ 365/189.12
6,198,649 B1 3/2001 Matsudera et al.
6,317,377 B1 * 11/2001 Kobayashi .................. 365/220

* cited by examiner

Primary Examiner—Richard Elms
Assistant Examiner—Tuan T. Nguyen
(74) Attorney, Agent, or Firm—Banner & Witcoff, Ltd.

(57) ABSTRACT

A semiconductor memory circuit capable of conducting an efficient test by using a memory tester is provided. A semiconductor memory circuit includes a memory cell array; a plurality of main data lines for conducting reading and writing every plural bits in parallel; and a shift register for converting parallel data read from memory cell array to the main data lines into serial data and supplying the converted data to data input/output terminals, and for converting write data supplied from the data input/output terminals in series into parallel data and supplying the converted data to the main data lines, and at least a portion of a plurality of the main data lines are arranged so as to be across each other between the memory cell array and the shift register. As a result, data compression is enabled during a test by a memory tester.

14 Claims, 10 Drawing Sheets

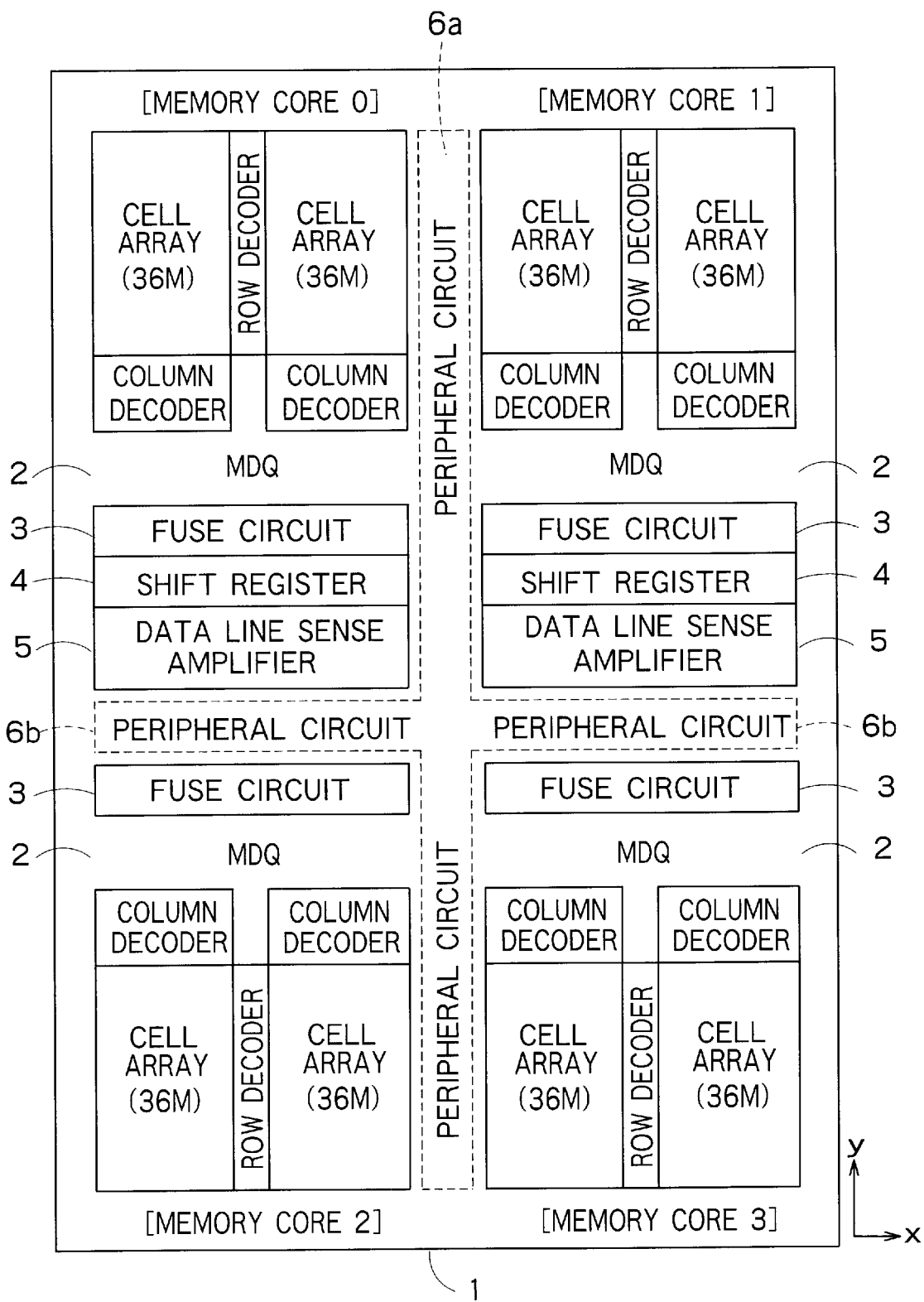
F I G. 1

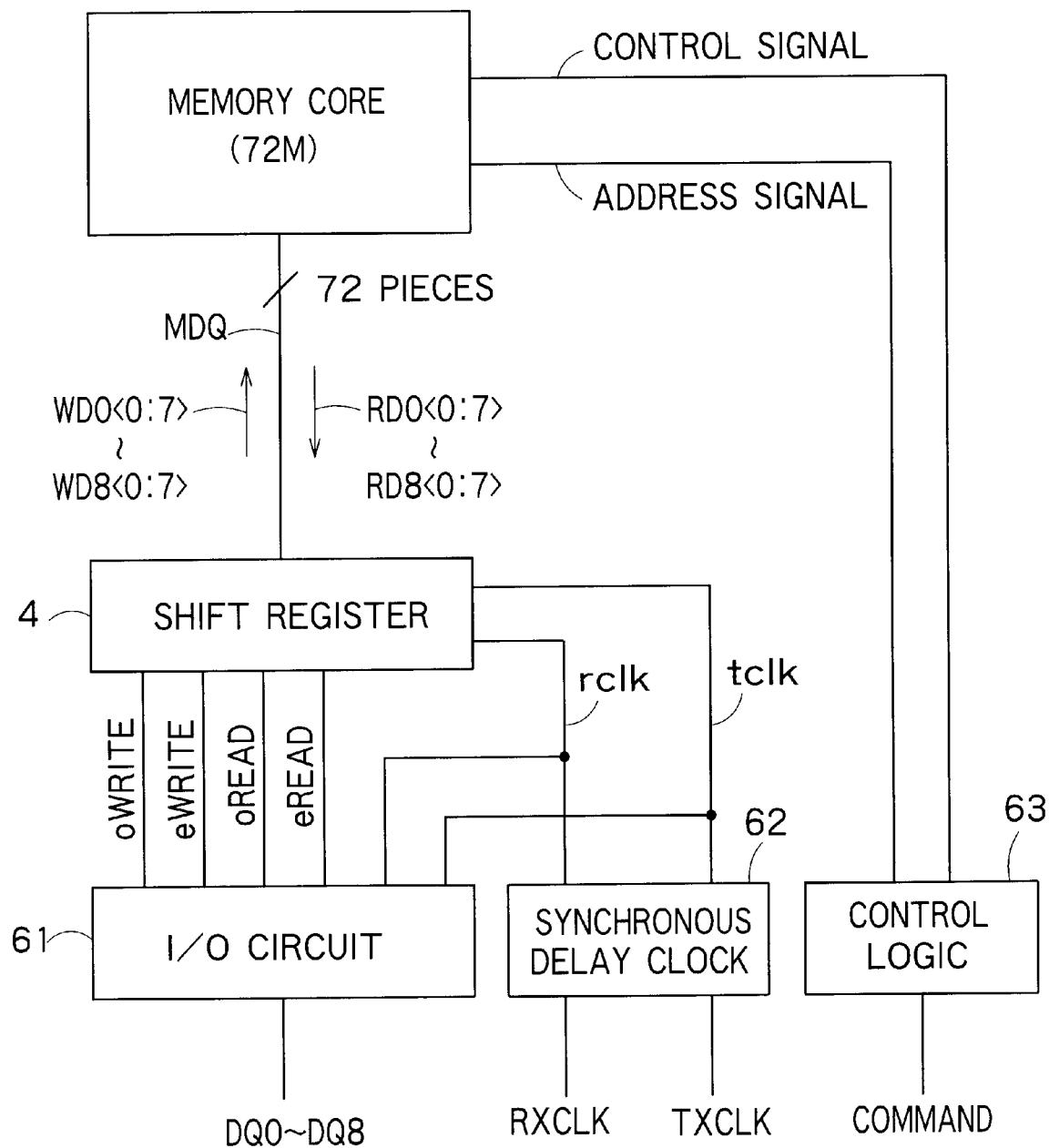
F I G. 2

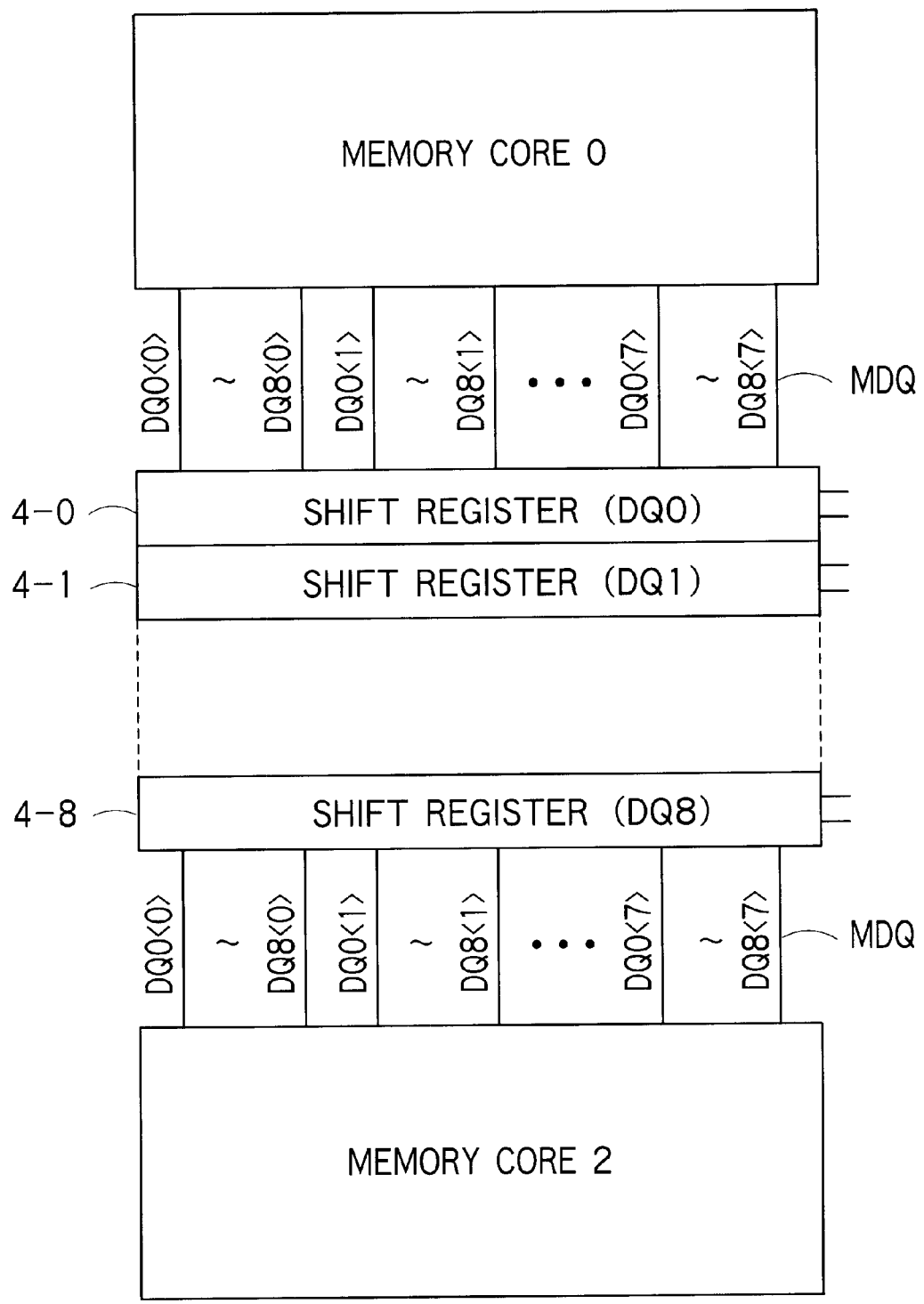
F I G. 3

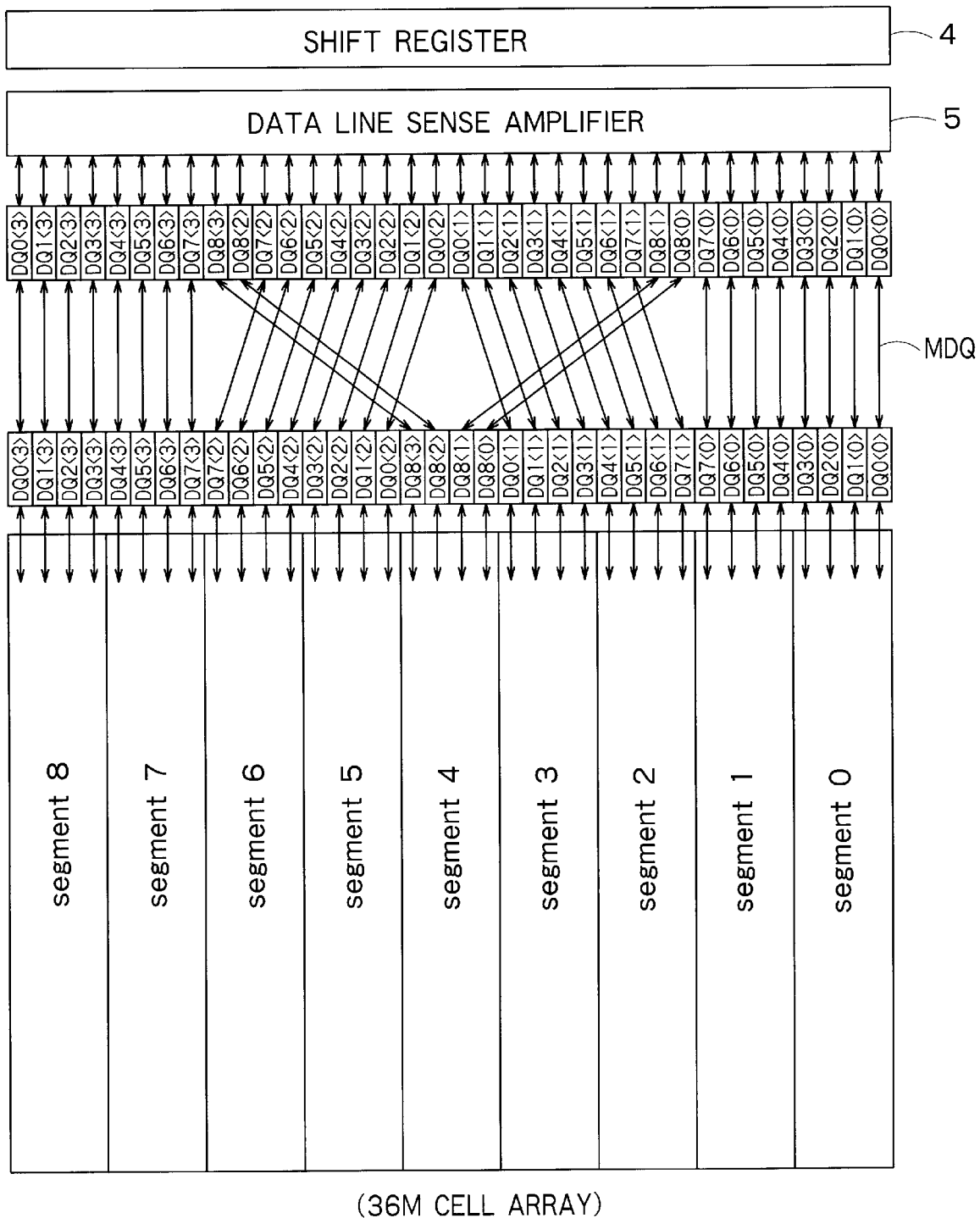
F I G. 4

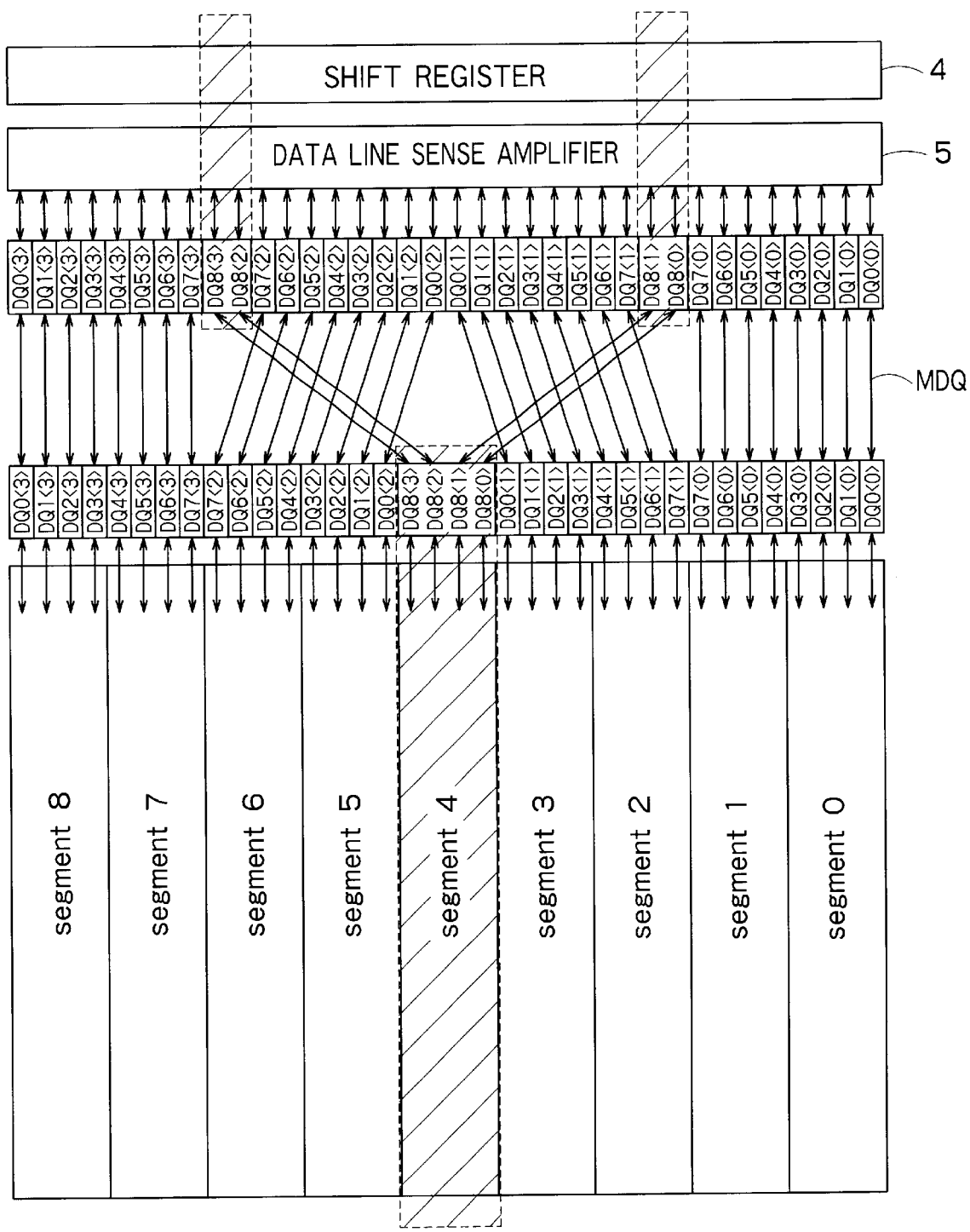
F I G. 5

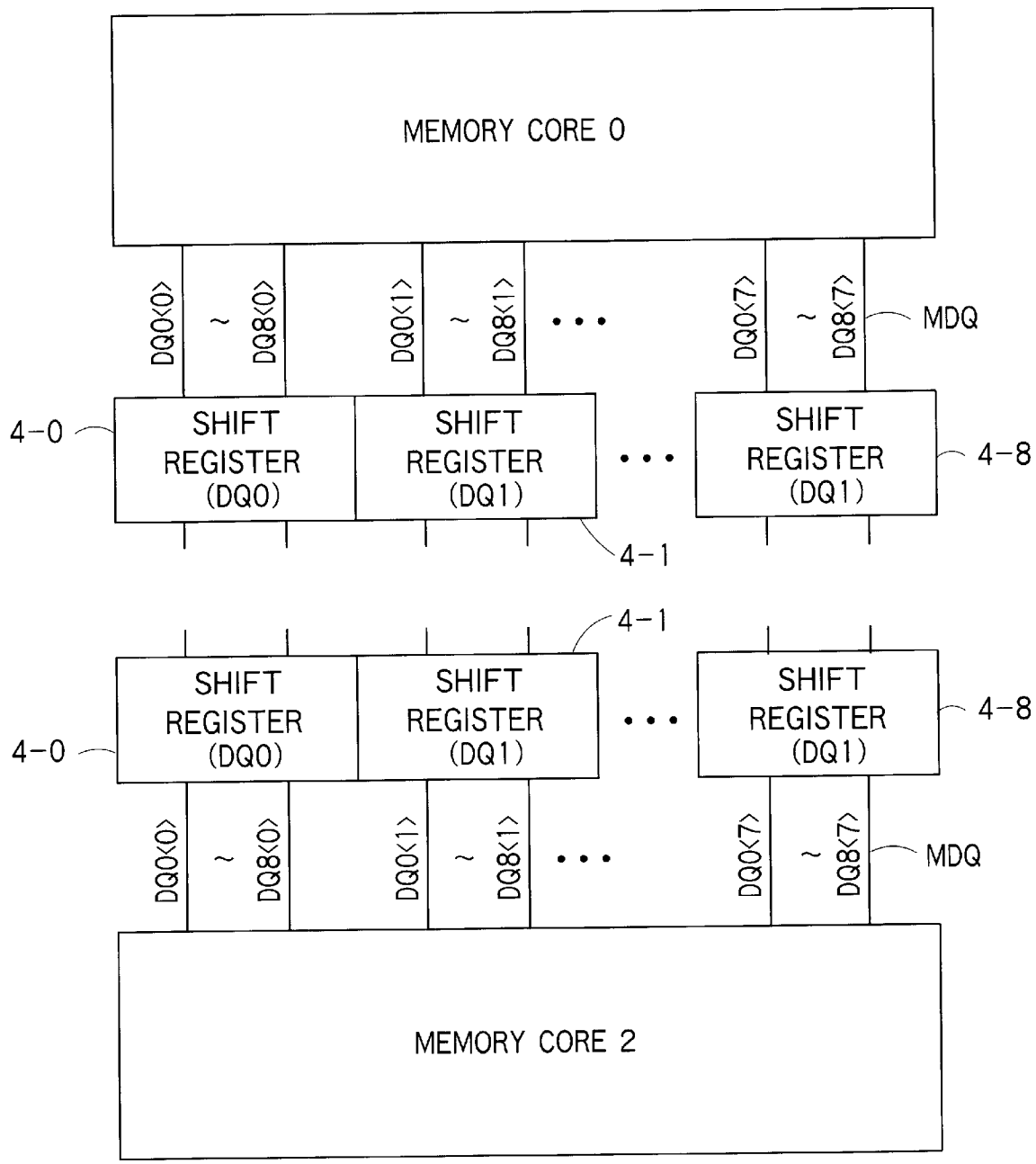
F I G. 8

SEMICONDUCTOR MEMORY CIRCUIT

CROSS REFERENCE TO RELATED APPLICATIONS

The subject application is related to subject matter disclosed in Japanese Patent Application No. 2000-285983 filed on Sep. 20, 2000 in Japan to which the subject application claims priority under Paris Convention and which is incorporated herein by reference.

BACKGROUND OF THE INVENTION

1. Field of the Invention

The present invention relates to a semiconductor memory integrated circuit, and more particularly to a semiconductor memory such as a DRAM for conducting parallel/serial conversion of read/write data by using a shift register to read/write data at a high speed.

2. Related Background Art

Conventionally, there is known a DRAM which controls data transfer between internal main data lines provided in a cell array region and I/O terminals whose number is smaller than that of the internal main data lines by using a shift register to realize a high-speed cycle. The shift register has a function for converting parallel read data from the cell array into serial data in synchronization with a clock and transmitting the converted data to an I/O circuit, and converting serial write data from the I/O terminals into parallel data and transferring the converted data to the data lines.

In this type of DRAM, the present applicant has first proposed a technique for optimizing arrangement of the cell array, the shift register, the peripheral I/O circuit and others in order to assure the symmetric property of data propagation in a chip and realize the margin of the considerable read/write operation (U.S. Pat. No. 6,198,649).

In the basic structure, four memory cores are symmetrically arranged to a rectangular chip in the vertical (y direction) and horizontal (x direction) directions. Here, the memory core is a cell array range which can be independently activated and includes a cell array including a bit line sense amplifier, a row decoder for selecting a word line and a column decoder for selecting a bit line. The data lines of each memory core are pulled out between the memory cores which are opposed to each other in the vertical direction. The shift register for controlling transfer of read/write data is arranged together with the data line sense amplifier circuit between the memory cores opposed to each other in the vertical direction. The peripheral circuit is arranged between the memory cores opposed to each other in the vertical direction and the memory cores opposed to each other in the horizontal direction.

In case of a 256-bit DRAM, each memory core includes 64 Mbits. Each memory core is divided into the cell arrays each having 32 Mbits in the horizontal direction, and the row decoder is arranged between these cell arrays. Each 64-Mbit memory core has 64 main data lines. With a column address designated by one column cycle, 16 column selection lines are simultaneously activated in this 64-Mbit memory core, and 4-bit data for one column line, i.e., a total of 64-bit parallel read/write data is allocated to 64 main data lines.

In case of producing such conventional DRAMs in large quantities, test cost is an important problem. In order to reduce the test cost, a larger number of memories which can be simultaneously tested by a memory tester is preferable. As one major factor for determining the number of memories which can be simultaneously measured by this memory tester, there is a redundancy algorithm for a capacity of a fail address memory (FAM) for storing a defective address in a memory tester and for failure remedy when the DRAM adopts the redundant circuit system.

Explaining this question in briefly, it is assumed that a capacity of the FAM of the memory tester is m bits, the test of a memory chip having a capacity of n bits. Since an area in the FAM corresponding to n bits is used in order to store an address of a defective cell, the number of the memory chips which can be simultaneously measured is m/n.

On the other hand, it is assumed that a unit of redundancy replacement is two word lines with respect to the row system and the number of bit lines which can be simultaneously selected by one column selection line is 4 as a unit with respect to the column system. Here, one bit of the row address of a defective address can be compressed and two bits of the column address of the same can be compressed respectively, and a total of 3 bits can be compressed and then stored in the FAM. As a result, the number of memory chips which can be simultaneously measured is $2^3 \times m/n$.

However, the above is only the simplified explanation, and a defect in a redundant cell portion must be also considered. Further, the algorithm may completely differ depending on the mode of the redundancy, and the simple data compression can not be necessarily conducted as in the above example.

Furthermore, even if the data compression itself does not have any restriction, most of memory testers have such a limitation as that designation of the data compression can not be changed during the test. This becomes a problem when the memory chip is a parity product in particular.

For example, in case of the regular 256-Mbit DRAM which is not a parity product, I/O terminal numbers can be continuously associated with every eight continuous lines in 64 (the number of wirings is doubled and hence 128 because complementary data lines are actually used) main data lines arranged in one 64-Mbit memory core. Moreover, when a range of every four data lines in each memory core is determined as one segment which can be a range of the defective column replacement, a combination of the I/O terminal numbers associated with the four main data lines in each segment is also uniquely determined. In this case, it is possible to clear the restriction of data compression of the memory tester, i.e., the restriction that only one set of I/O compression can be designated during the test.

On the contrary, in case of a parity production obtained by adding one-bit parity bit to the 256-Mbit DRAM for the eight-bit parallel output, one segment of four main data lines is added, and the memory capacity becomes 288 Mbits. In addition, nine main data lines for parallel output and nine I/O terminals DQ0 to DQ8 are provided.

Here, if the column redundancy is adopted, one segment includes 64 column selection lines and at least one spare column selection line, and activation of one column selection line causes four bit lines to be simultaneously connected to four data lines. If there is a defective column, replacement by the spare column line is carried out in units of one segment.

In case of this type of parity product, the I/O terminal numbers associated with every four main data lines in each segment in the memory core become irregular by the usual data line wiring method. FIG. 9 shows the state of the main data line arrangement.

FIG. 9 shows a half of a 72-Mbit memory core, i.e., 36 main data lines MDQ of the cell array corresponding to 36 Mbits. Reference character DQn<v>added to an I/O terminal number assigned to the main data line MDQ means a v-th serial data of an n-th I/O terminal. That is, the serial data is transmitted in the order of DQn<0>, DQn<1>, . . . DQn<3>.

Table 1 shows assignment of the I/O terminals of the main data lines with respect to the nine segments segment0 to segment8 in this example.

TABLE 1

| | |
|---|---|
| segment0 | [DQ0<0>, DQ1<0>, DQ2<0>, DQ3<0>] |
| segment1 | [DQ4<0>, DQ5<0>, DQ6<0>, DQ7<0>] |
| segment2 | [DQ8<0>, DQ8<1>, DQ7<1>, DQ6<1>] |
| segment3 | [DQ5<1>, DQ4<1>, DQ3<1>, DQ2<1>] |
| segment4 | [DQ1<1>, DQ0<1>, DQ0<2>, DQ1<2>] |
| segment5 | [DQ2<2>, DQ3<2>, DQ4<2>, DQ5<2>] |
| segment6 | [DQ6<2>, DQ7<2>, DQ8<2>, DQ8<3>] |
| segment7 | [DQ7<3>, DQ6<3>, DQ5<3>, DQ4<3>] |
| segment8 | [DQ3<3>, DQ2<3>, DQ1<3>, DQ0<3>] |

Ignoring each serial data number in <> in Table 1 and paying attention to the I/O terminal number, namely, "n" in "DQn", for example, the segment0 and the segment8 commonly use a combination of [DQ0, DQ1, DQ2, DQ3]. However, for example, the segment3, 5 include DQ2 and DQ3 and use a combination different from that of the segment0, 8.

According to the restriction conditions for data compression of the memory tester mentioned above, when taking notice to a given I/O terminal number in Table 1, for example, "DQ1" during the test, only one combination of the I/O terminal numbers including this I/O terminal number in each segment is allowed. Therefore, I/O data compression is impossible in combinations shown in Table 2.

The above-described problem can be solved if a capacity of the FAM of the memory tester is large, but additional installation of the FAM leads to increase in the test cost. If the FAM is not additionally provided, the number of memory chips which can be simultaneously measured is restricted, which also results in increase in the test cost.

Another problem concerning the main data line arrangement shown in FIG. 9 is that a change in design is not easy when a non-parity product of 256 Mbits is cut down with the above-described parity product of 288 Mbits as a mother product.

The technique for producing a small-capacity memory having a basic standard similar to that of a large-capacity mother product by cut-down is important because the redesign cost of the memory can be reduced. However, when a part of the I/O terminal number DQ8 corresponding to the parity bit is excluded from the structure of the cell array and the main data line shown in FIG. 9, the structure illustrated in FIG. 10 can be obtained. Shaded portions in FIG. 10 correspond to the parts excluded by cut-down. For layout of the memory, respective halves of the two segment2, 6 are cut of f as shown in the drawing. Considering that repetition of a regular pattern forms one segment, cut-down is not easy.

As described above, in the prior art DRAM, the number of memory chips which can be simultaneously tested is restricted because of the limitation of functions of the memory tester, which leads to increase in the test cost, and the cut-down design is no easy.

SUMMARY OF THE INVENTION

A semiconductor memory circuit comprising:
a memory cell array;
a plurality of main data lines configured to conduct reading and writing of plural bits in parallel with respect to said memory cell array; and
a shift register configured to convert parallel data read from said memory cell array to said main data lines into serial data and supplying the converted data to data input/output terminals, and configured to convert write data supplied from said data input/output terminals in series into parallel data and supplying the converted data to said main data lines,
at least portion of a plurality of said main data lines being arranged to be across each other between said memory cell array and said shift register.

BRIEF DESCRIPTION OF THE DRAWINGS

FIG. 1 shows a schematic layout of a DRAM chip 1 according to an embodiment of the present invention;

FIG. 2 is a view showing the state of transfer of read/write data by a shift register;

FIG. 3 is a view showing the connection relationship between the shift register and a memory core;

FIG. 4 is a view showing the state of wiring of main data lines and alignment of I/O terminal numbers;

FIG. 5 is a view showing cut-down areas by oblique lines;

FIG. 8 is a view showing a modification of arrangement of the shift register.

DESCRIPTION OF THE PREFERRED EMBODIMENTS

Figure 6:
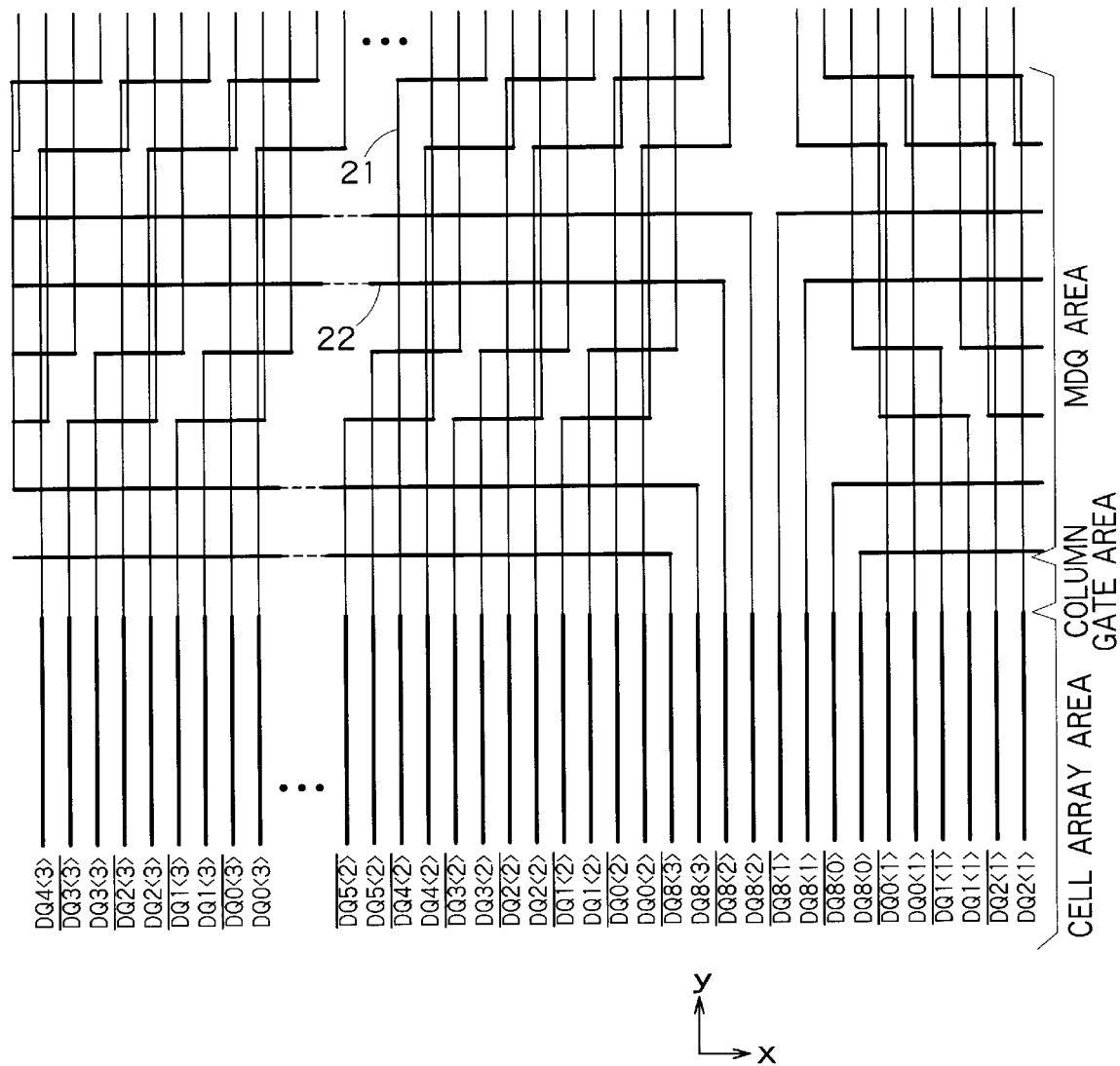
FIG. 6 is a view showing an example of cross wiring of main data lines MDQ depicted in FIG. 4.

An embodiment according to the present invention will now be described with reference to the accompanying drawings. Although a DRAM will be mainly explained in the embodiment described below, the present invention is not restricted to the DRAM and can be applied to an SRAM or a ferroelectric memory.

FIG. 1 shows a schematic layout of a DRAM chip 1 according to the embodiment of the present invention. The DRAM chip 1 in this embodiment is a 288-Mbit product in which a parity bit of one bit is added to eight-bit parallel data, and has four memory cores 0 to 3 each having 72 Mbits. In 72 Mbits, 64 Mbits are used for usual data storage and remaining 8 Mbits are used for storage of the parity bit.

Each two of the memory cores 0 to 3 are arranged in the x direction and the y direction of the rectangular chip 1 as shown in the drawing. Each of the memory cores 0 to 3 is divided into right and left cell arrays each having 36 Mbits, and a row decoder for conducting word line selection is arranged between these cell arrays. Further, a column decoder (including a column gate) for effecting bit line selection is arranged at the end in the y direction of each cell array.

An area of 72 main data lines (MDQ) 2 is arranged for each of the memory cores 0 to 3, and the main data lines MDQ are connected to a shift register 4 shared by the memory cores opposed to each other in the vertical direction (y direction) in FIG. 1. This shift register 4 conducts parallel/serial conversion of read/write data. That is, parallel read data outputted from the memory core is converted into serial data by the shift register 4, and the converted data is then supplied to a data input/output (I/O) buffer included in a peripheral circuit 6. Furthermore, write data supplied from the I/O buffer in series is converted into parallel data by the shift register 4 and then transferred to the main data lines MDQ.

Besides, a data line sense amplifier circuit 5 is connected to the main data lines MDQ. The read data from the memory cores 0 to 3 is amplified by the data line sense amplifier circuit 5 and then transferred to the shift register 4. Moreover, the write data which is converted from serial data into parallel data by the shift register 4 to be supplied is amplified by the data line sense amplifier circuit 5 to be supplied to the memory core.

A fuse circuit 3 for remedying a defect is arranged between the upper and lower memory cores shown in FIG. 1 in accordance with each of the memory cores 0 to 3. Each periphery circuit 6 is arranged at a portion 6a extending toward the central portion of the chip 1 in the y direction and a portion 6b extending toward the same in the x direction. This peripheral circuit 6 has an I/O buffer, a clock circuit, a logic controller and others.

FIG. 2 shows the state of transfer of read/write data by the shift register 4 taking notice to one memory core. An I/O circuit 61 included in the peripheral circuit 6 includes an I/O buffer and a multiplexer. A synchronous delay clock circuit 62 and a control logic 63 are also included in the peripheral circuit 6. The synchronous delay clock circuit 62 generates an internal data write clock rclk and an internal data read clock tclk synchronized with external clocks RXCLK and TXCLK, and carries out transfer control of the shift register 4 and transfer control of the I/O circuit 61 based on these clocks. The control logic circuit 63 decodes an address and a command COMMAND to generate an address signal and a control signal which are supplied to the memory core.

The write data supplied to data input/output terminals (I/O terminals) DQ0 to DQ8 from the outside is controlled by the clock in the I/O circuit 61 and sequentially fed to the shift register 4 as serial data with which write data oWRITE in an odd cycle and write data eWRITE in an even cycle can be sequentially obtained. Then, the write data is transferred to the main data lines MDQ as parallel write data WD0<0:7>to WD8<0:7>in the shift register 4. In case of reading, parallel read data RD0<0:7>to RD8<0:7>outputted from the memory core to the main data lines MDQ are similarly controlled by the clocks in the shift register 4 and converted into serial data in which the read data oREAD in an odd cycle and the read data eREAD in an even cycle are sequentially aligned and then transferred to the I/O circuit 61.

More specifically, the shift register 4 is constituted by nine shift register blocks 4–0 to 4–8 corresponding to the respective I/O terminal numbers DQ0 to DQ8 as shown in FIG. 3. These shift register blocks 4–0 to 4–8 are shared by the memory cores opposed to each other in the vertical direction in FIG. 1. The numbers of the I/O terminals DQ0 to DQ8 are assigned to the 72 main data lines MDQ of each memory core as shown in the drawing.

Figure 9:
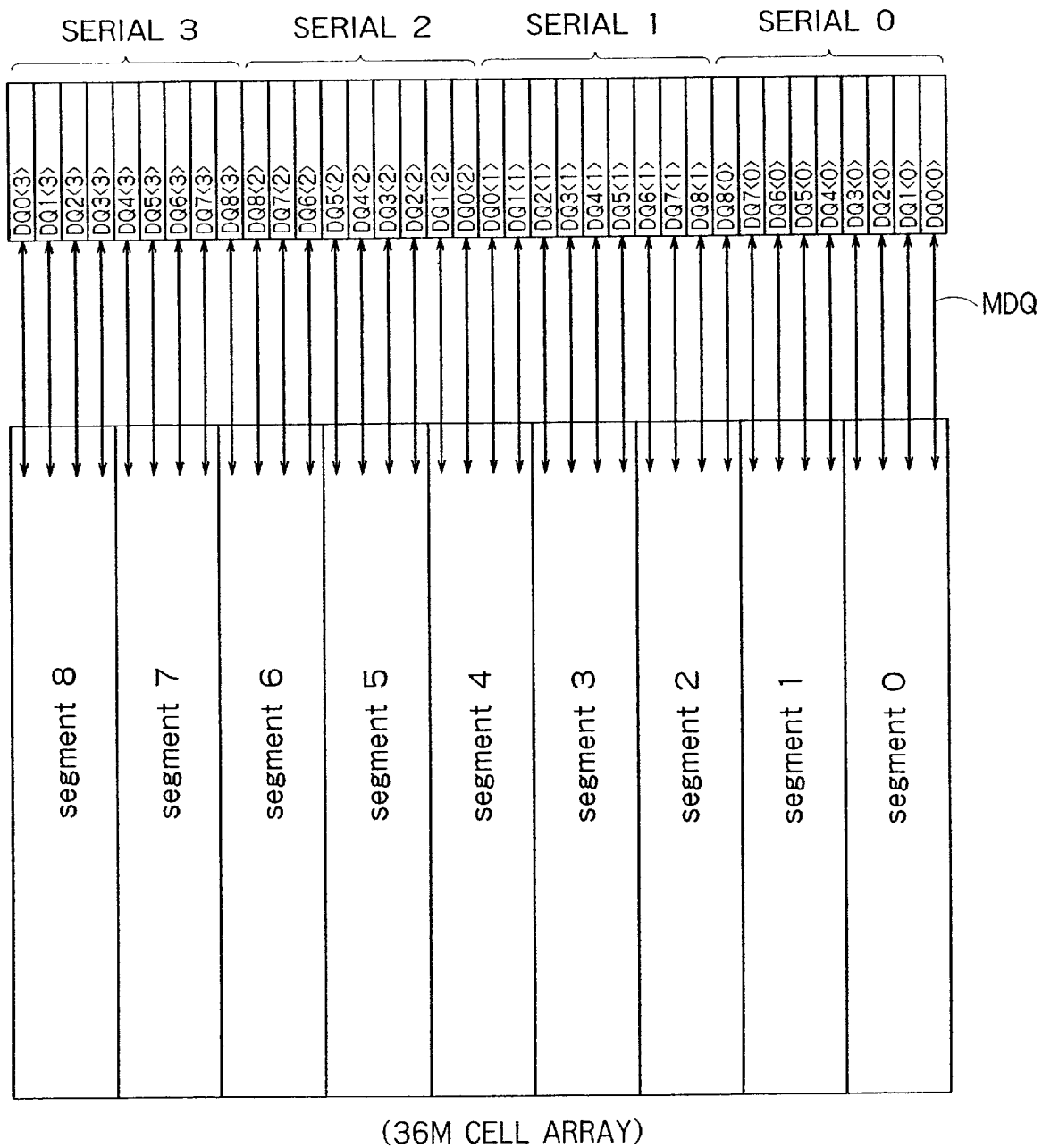
FIG. 9 is a view showing arrangement of a half of the main data lines of the memory core.

FIG. 4 shows the state of wiring of the main data lines MDQ and assignment of the I/O terminal numbers with respect to a half of one memory core, i.e., the 36-Mbit cell array in association with the prior art in FIG. 9. The 36-Mbit cell array is divided into nice segments segment0 to segment8, and four main data lines are connected to each segment.

Figure 7:
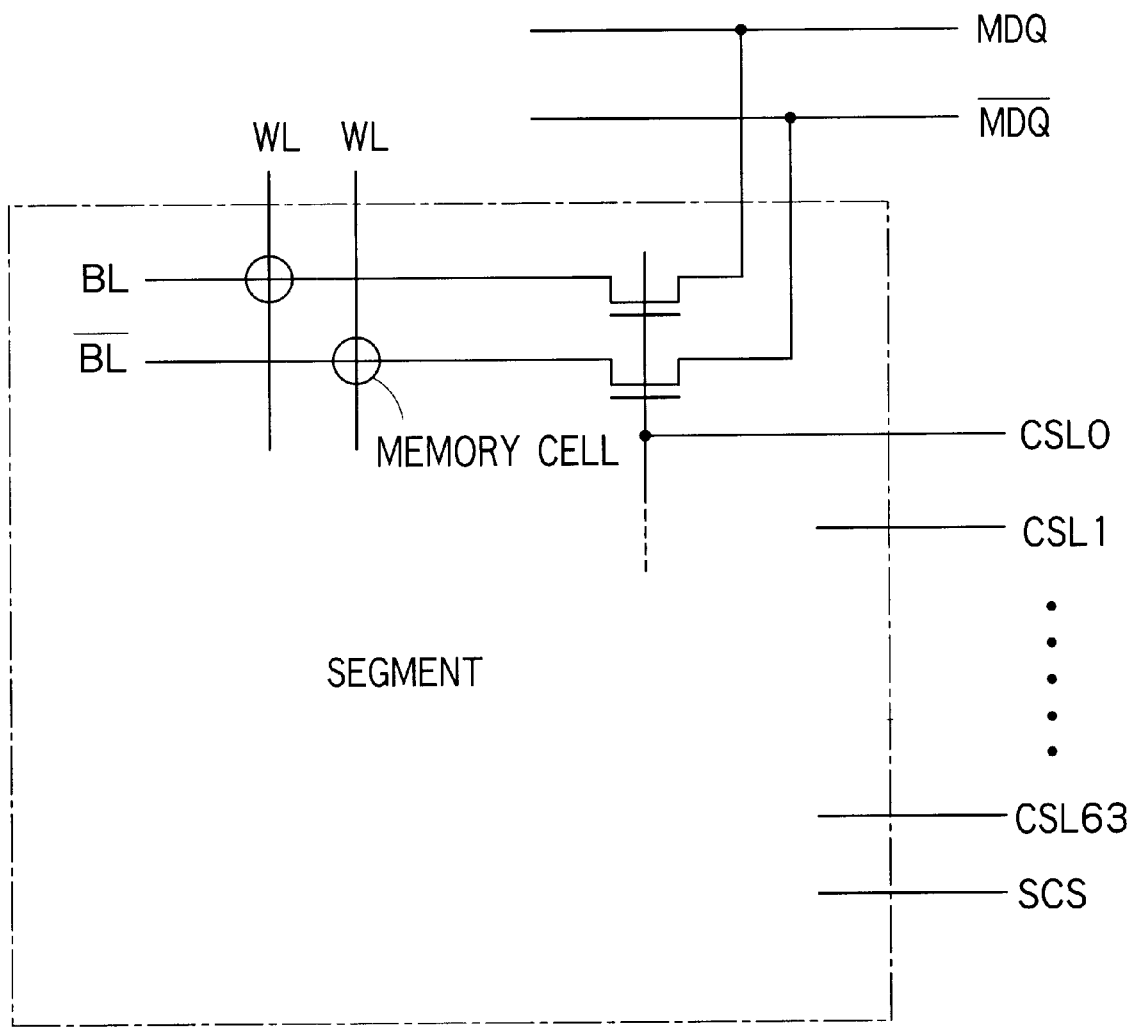
FIG. 7 is a view showing arrangement of column selection lines.

If the column redundancy is adopted, each segment includes 64 column selection lines CSL0 to CSL63 and at least one spare column selection line SCSL as shown in FIG. 7. Two bit lines BL, /BL are simultaneously connected to two main data lines MDQ, /MDQ by activation of one column selection line.

Here, one segment corresponds to a range in which replacement by the spare column selection line SCSL in a defective column is carried out when such a defective column exists. That is, replacement of a defective column is conducted in units of segment.

One memory core conducts reading/writing at the same time in parallel through the 36 main data lines MDQ shown in FIG. 4 in one column cycle. On the contrary, data transmission to/from the outside of the chip is carried out every nine bits through the I/O terminals DQ0 to DQ8 by conducting parallel/serial conversion in the shift register.

As different from FIG. 9, assignment of the I/O terminals to the main data lines MDQ at the end of each segment in the cell array is not carried out in the order of the I/O terminal numbers but the I/O terminal number "8" are collected at the position of the segment 4. Moreover, the main data lines MDQ are partially arranged so as to be across each other in the wiring area before the data line sense amplifier circuit 5 in such a manner that the I/O terminal numbers are aligned in order. Realignment of the I/O terminal numbers is conducted in order to satisfy the restriction conditions with respect to data compression by the memory tester during the test.

Further speaking of comparison with FIG. 9, the numbers of the I/O terminal DQ8 for the parity bit are assigned to the segments 2 and 6 in FIG. 9. In other words, spare segments which are added to the $2^3=8$ segments corresponding to a necessary data amount for the parity bit are separately arranged by separating into the segments 2 and 6. Here, the number of segments can be expressed as $2^n$ (n is a positive integer).

On the contrary, in the structure shown in FIG. 4, the I/O terminals DQ8 for the parity bit are collectively associated with only the segment segment4. That is, only the segment segment4 is used as a spare segment exclusively used for the parity bit.

In this embodiment, Table 2 shows the relationship between the respective segment numbers and the I/O terminals associated with the respective segment in connection with Table 1.

TABLE 2

| |
|---|
| segment0 [DQ0<0>, DQ1<0>, DQ2<0>, DQ3<0>] |
| segment1 [DQ4<0>, DQ5<0>, DQ6<0>, DQ7<0>] |
| segment2 [DQ7<1>, DQ6<1>, DQ5<1>, DQ4<1>] |
| segment3 [DQ3<1>, DQ2<1>, DQ1<1>, DQ0<1>] |
| segment4 [DQ8<0>, DQ8<1>, DQ8<2>, DQ8<3>] |
| segment5 [DQ0<2>, DQ1<2>, DQ2<2>, DQ3<2>] |
| segment6 [DQ4<2>, DQ5<2>, DQ6<2>, DQ7<2>] |
| segment7 [DQ7<3>, DQ6<3>, DQ5<3>, DQ4<3>] |
| segment8 [DQ3<3>, DQ2<3>, DQ1<3>, DQ0<3>] |

As apparent from Table 2, each segment is associated so that there is only one combination of the I/O terminal numbers including the same I/O terminal number.

For example, when paying attention to the I/O terminal number "DQ1", the combination of the I/O terminal numbers is the same in all the segments segment0, 3, 5 and 8 including this I/O terminal number. This is also true to other I/O terminal numbers, and there is only one combination of the I/O terminal numbers in each segment. As a result, the restriction conditions for the I/O data compression in the memory tester can be satisfied, and data compression of two bits is enabled when simultaneously selecting four bits with one column selection line. That is, the number of the I/O terminals can be substantially compressed to ¼ to conduct the test in the memory tester.

Consequently, the number of memory chips which can be simultaneously measured by the memory tester is increased and the test cost can be eliminated. Specifically, when data compression of a total of three bits is carried out as well as data compression of one bit of the row system, 64 288-Mbit DRAMs can be simultaneously measured by the memory tester having an FAM of 4.5 Gbits. As to the redundancy efficiency, there is not need to modify the simultaneous replacement of one bit (two rows) in the row system and the simultaneous replacement of two bits (four columns) in a range selected by one column selection line in the column system. Therefore, the redundancy efficiency is not lowered.

FIG. 6 shows an example of the cross wiring of the main data lines MDQ illustrated in FIG. 4. The main data lines MDQ are actually provided as complementary signal lines as shown in the drawings. A vertical (x direction) wiring 22 in FIG. 6 is a first layer metal wiring, and a horizontal (y direction) wiring 21 is a second layer metal wiring. The respective wiring pitches do not have to be necessarily fixed. Further, a heavy line in FIG. 6 indicates that a pattern width is larger than that of a thin line.

The main data lines are arranged so as to be across each other in the column gate area and the MDQ area by utilizing the first layer metal wiring and the second layer metal wiring. The first layer metal wiring and the second layer metal wiring are connected to each other through a via contact.

Figure 10:
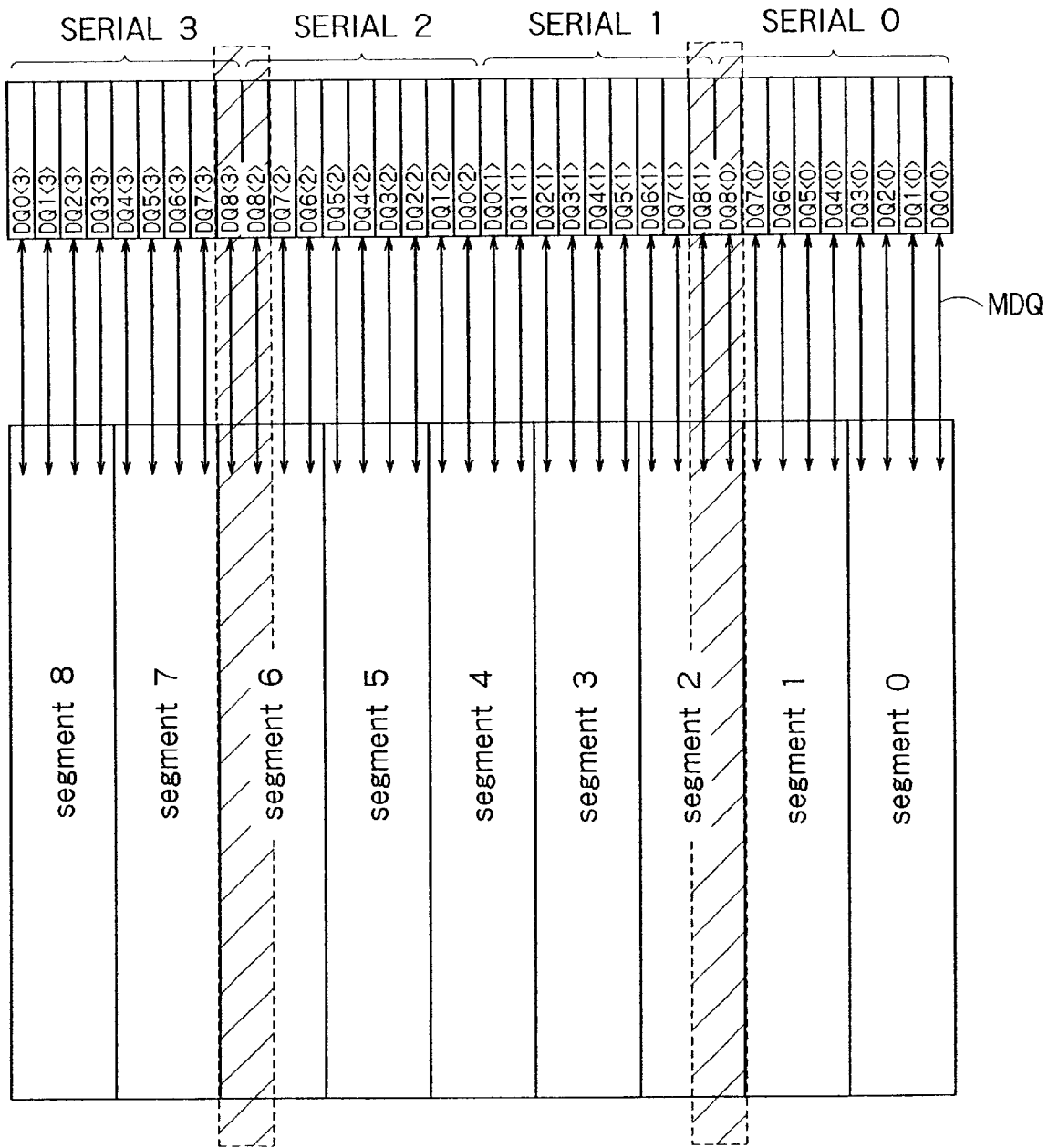
FIG. 10 is a modified view of FIG. 9.

In case of changing assignment of the I/O terminal numbers of the main data lines MDQ such as shown in FIG. 4, when the 256-Mbit DRAM which is a non-parity product is cut down from this 288-Mbit DRAM, the cut-down area indicated by oblique lines in FIG. 5 can be obtained. In the cell array area, it is good enough to completely delete one segment segment4 in which the main data lines MDQ having the I/O terminal number "8" for the parity bit are collected. Since this deletes one arrangement unit in the cell array, redesign is easier than that in the case where the cut-down area extends over two segment areas according to the prior art system as illustrated in FIG. 10.

The present invention is not restricted to the above-described embodiment. FIG. 8 shows an example in which the alignment of the main data lines MDQ and the arrangement of the shift register 4 are conditions different from those in FIG. 3. As similar to FIG. 3, the shift register is provided in accordance with each of the I/O terminals, and the main data lines connected to the output terminal of the same shift register are aligned to be adjacent to each other and connected to the memory core.

Even in case of FIG. 8, when the wirings are across each other in such a manner that the association of the I/O terminal numbers of the main data lines MDQ is recomposed at the cell array end portions and the input portions of the shift register 4, the restriction conditions concerning data compression of the memory tester can be similarly satisfied as in FIG. 3.

What is claimed is:

1. A semiconductor memory circuit comprising:
   a memory cell array;
   a plurality of main data lines configured to conduct reading and writing of plural bits in parallel with respect to said memory cell array; and
   a shift register configured to convert parallel data read from said memory cell array to said main data lines into serial data and supplying the converted data to data input/output terminals, and configured to convert write data supplied from said data input/output terminals in series into parallel data and supplying the converted data to said main data lines,
   at least portion of a plurality of said main data lines being arranged to be across each other between said memory cell array and said shift register.

2. The semiconductor memory circuit according to claim 1, wherein said at least portion of a plurality of said main data lines are arranged so as to be across each other between said memory cell array and said shift register in such a manner that data compression by a memory tester is enabled during a test.

3. The semiconductor memory circuit according to claim 1, further comprising a sense amplifier configured to amplify data read from said memory cell array and supplying the amplified data to said shift register, and configured to amplify parallel data outputted from said shift register and supplying the amplified data to said memory cell array,
   said at least portion of a plurality of said main data lines being arranged so as to be across each other between said memory cell array and said sense amplifier.

4. The semiconductor memory circuit according to claim 1, wherein said memory cell array comprises:
   four memory cores which are individually activated, based on a decoding result by a row decoder configured to carry out word line selection and a decoding result by a column decoder configured to conduct bit line selection,
   each two of said four memory cores being arranged in vertical and horizontal directions, respectively,
   said shift register being arranged between each two memory cores arranged in the vertical direction or the horizontal direction, said shift register being shared by said two memory cores provided on the both sides thereof.

5. The semiconductor memory circuit according to claim 4, wherein said two memory cores sharing said shift register utilize said shift register by mutually staggering the timing.

6. The semiconductor memory circuit according to claim 3, wherein said memory cell array comprises:
   four memory cores, which are independently activated, based on a decoding result by a row decoder configured to carry out word line selection and a decoding result by a column decoder configured to conduct bit line selection,
   each two of said four memory cores being arranged in vertical and horizontal directions, respectively,
   said sense amplifier being arranged between each two memory cores arranged in the vertical direction or the horizontal direction, said sense amplifier being shared by said two memory cores provided on the both sides thereof.

7. The semiconductor memory circuit according to claim 6, wherein said two memory cores sharing said sense amplifier utilize said sense amplifier by mutually staggering the timing.

8. The semiconductor memory circuit according to claim 1, wherein said memory cell array comprises:
   four memory cores, which are individually activated, based on a decoding result by a row decoder configured to carry out word line selection and a decoding result by a column decoder configured to conduct bit line selection,
   each two said four memory cores being arranged in vertical and horizontal directions, respectively, wherein said each memory core has a plurality of segments including a plurality of column selection lines configured to select bit lines different from each other and at least one spare column selection line configured to replace a defective part in units of a column selection line.

9. The semiconductor memory circuit according to claim 8, wherein at least one combination of said data input/output terminals is associated with each of a plurality of said segments, and the same data input/output terminals are included in only the same combination.

10. The semiconductor memory circuit according to claim 1, wherein said shift register is provided in accordance with each of said data input/output terminals, and said main data lines connected to output terminals of said shift registers different from each other are alternately adjacently arranged.

11. The semiconductor memory circuit according to claim 1, wherein said shift register is provided in accordance with each of said data input/output terminals, and said main data lines connected to output terminals of the same shift registers are adjacently arranged.

12. The semiconductor memory circuit according to claim 8, wherein a plurality of segments include $2^n$ usual segments according to the number of bits n (n is a positive integer) data to be read/written, and a spare segment provided to add a parity bit to read/write data.

13. The semiconductor memory circuit according to claim 12, wherein a plurality of main data lines configured to transmit/receive data to/from said spare segment are associated with only data input/output terminals for a parity bit.

14. The semiconductor memory circuit according to claim 1, wherein said plurality of main data lines are formed on at least upper and lower two layers on a semiconductor substrate, and said at least portion of a plurality of said main data lines are arranged so as to be across each other by utilizing said upper and lower two layers.

* * * * *

UNITED STATES PATENT AND TRADEMARK OFFICE
CERTIFICATE OF CORRECTION

PATENT NO.   : 6,466,490 B2
DATED        : October 15, 2002
INVENTOR(S)  : Takeshi Nagai et al.

It is certified that error appears in the above-identified patent and that said Letters Patent is hereby corrected as shown below:

<u>Title page,</u>
Item [57], ABSTRACT, -- the -- has been inserted before "memory cell array to";

<u>Column 8,</u>
Line 6, -- a -- has been inserted after "at least";
Line 35, "the" has been removed;
Line 53, "the" has been removed;
Line 66, -- of -- has been inserted before "said four memory cores".

Signed and Sealed this

Eighteenth Day of March, 2003

JAMES E. ROGAN
*Director of the United States Patent and Trademark Office*